United States Patent
Shen et al.

(10) Patent No.: US 9,754,634 B2
(45) Date of Patent: Sep. 5, 2017

(54) MEMORY MANAGEMENT SYSTEM WITH POWER SOURCE AND METHOD OF MANUFACTURE THEREOF

(75) Inventors: Jinying Shen, San Ramon, CA (US); Robert Tower Frey, Milpitas, CA (US); Kelvin Marino, Laguna Hills, CA (US); Joshua Harris Brooks, Alameda, CA (US)

(73) Assignee: SMART Modular Technologies, Inc., Newark, CA (US)

( * ) Notice: Subject to any disclaimer, the term of this patent is extended or adjusted under 35 U.S.C. 154(b) by 992 days.

(21) Appl. No.: 13/303,863

(22) Filed: Nov. 23, 2011

(65) Prior Publication Data
US 2013/0128685 A1    May 23, 2013

(51) Int. Cl.
*G11C 5/14* (2006.01)

(52) U.S. Cl.
CPC ......... *G11C 5/141* (2013.01); *Y10T 29/49117* (2015.01)

(58) Field of Classification Search
CPC .................................................. G11C 5/141
USPC ...... 365/226–229; 711/161, 162; 714/14, 22
See application file for complete search history.

(56) References Cited

U.S. PATENT DOCUMENTS

| | | | |
|---|---|---|---|
| 5,144,692 A | 9/1992 | Baker et al. | |
| 5,799,200 A | 8/1998 | Brant et al. | |
| 6,336,174 B1 | 1/2002 | Li et al. | |
| 6,496,939 B2 | 12/2002 | Portman et al. | |
| 6,693,840 B2 | 2/2004 | Shimada et al. | |
| 6,816,428 B2* | 11/2004 | Zimmermann et al. | 365/226 |
| 7,107,480 B1 | 9/2006 | Moshayedi et al. | |
| 7,269,755 B2 | 9/2007 | Moshayedi et al. | |
| 7,397,707 B2 | 7/2008 | Mokhlesi | |
| 7,409,590 B2 | 8/2008 | Moshayedi et al. | |
| 7,462,527 B2 | 12/2008 | Conti et al. | |
| 7,634,688 B2 | 12/2009 | Madter et al. | |
| 7,688,661 B2 | 3/2010 | Fujioka et al. | |
| 7,830,732 B2 | 11/2010 | Moshayedi et al. | |
| 2010/0008175 A1* | 1/2010 | Sweere et al. | 365/229 |
| 2010/0229021 A1* | 9/2010 | Konstadinidis et al. | 713/601 |
| 2013/0272054 A1* | 10/2013 | Daudelin | G11C 5/148 365/149 |

\* cited by examiner

*Primary Examiner* — Khamdan Alrobaie
(74) *Attorney, Agent, or Firm* — Wong & Rees LLP

(57) ABSTRACT

A method of manufacture of the memory management system includes: fabricating a dual in-line memory module carrier; mounting a volatile memory device on the dual in-line memory module carrier; mounting a non-volatile memory on the dual in-line memory module carrier on a side opposite the volatile memory device; mounting an uninterruptible power supply on the dual in-line memory module carrier for maintaining a memory module power when a system power input decays; and mounting a controller logic integrated circuit on the dual in-line memory module carrier coupled to the volatile memory device, the non-volatile memory, and the uninterruptible power supply for copying data content of the volatile memory device to the non-volatile memory when the uninterruptible power supply detects the decay of the system power input to a first cross-over level.

20 Claims, 5 Drawing Sheets

MEMORY MANAGEMENT SYSTEM WITH POWER SOURCE AND METHOD OF MANUFACTURE THEREOF

TECHNICAL FIELD

The present invention relates generally to a memory management system, and more particularly to a system for providing power to a dual in-line memory module.

BACKGROUND ART

Contemporary high performance computing main memory systems are generally composed of one or more memory devices, such as dual in-line memory modules (DIMMs), which are connected to one or more memory controllers and/or processors. The DIMMs can be connected via one or more memory interface elements such as buffers, hubs, bus-to-bus converters, etc. The memory devices are generally located in a memory subsystem and are often connected via a pluggable interconnection system by one or more connectors to a system board, such as a personal computer (PC) motherboard.

Overall computer system performance is affected by each of the key elements of the computer structure, including the performance/structure of the processor, any memory caches, the input/output (I/O) subsystem, the efficiency of the memory control functions, the performance of the main memory devices, any associated memory interface elements, and the type and structure of the memory interconnect interface.

Some vital computer applications rely on data integrity and go to extreme lengths to protect the data from unexpected faults, such as power failures. Most storage systems make some provision for storing pending data in the event of a power failure, but most are on a best effort basis and rely on transient energy sources to preserve as much data as possible before the energy runs out. In disk drives for instance, the spinning media becomes a source of energy utilized to store any residual unwritten data.

Data that could not have been transferred from system memory to a peripheral storage system can be a greater risk. In applications that rely on data integrity, other accommodations must be made at the system level. A standard approach to preserving system operation is a battery back-up structure that maintains the system power for some duration, but this approach consumes significant space and can only be a short term solution. Beyond the duration of the battery back-up system, the critical data would be lost.

Thus, a need still remains for a memory management system with power source. In view of the increasing need to protect mission critical data, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of the memory management system including: fabricating a dual in-line memory module carrier; mounting a volatile memory device on the dual in-line memory module carrier; mounting a non-volatile memory on the dual in-line memory module carrier on a side opposite the volatile memory device; mounting an uninterruptible power supply on the dual in-line memory module carrier for maintaining a memory module power when a system power input decays; and mounting a controller logic integrated circuit on the dual in-line memory module carrier coupled to the volatile memory device, the non-volatile memory, and the uninterruptible power supply for copying data content of the volatile memory device to the non-volatile memory when the uninterruptible power supply detects the decay of the system power input to a first cross-over level.

The present invention provides a memory management system including: a dual in-line memory module carrier; a volatile memory device mounted on the dual in-line memory module carrier; a non-volatile memory mounted on the dual in-line memory module carrier on a side opposite the volatile memory device; an uninterruptible power supply on the dual in-line memory module carrier for maintaining a memory module power when a system power input decays; and a controller logic integrated circuit mounted on the dual in-line memory module carrier coupled to the volatile memory device, the non-volatile memory, and the uninterruptible power supply for copying data content of the volatile memory device to the non-volatile memory when the uninterruptible power supply detects the decay of the system power input to a first cross-over level.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
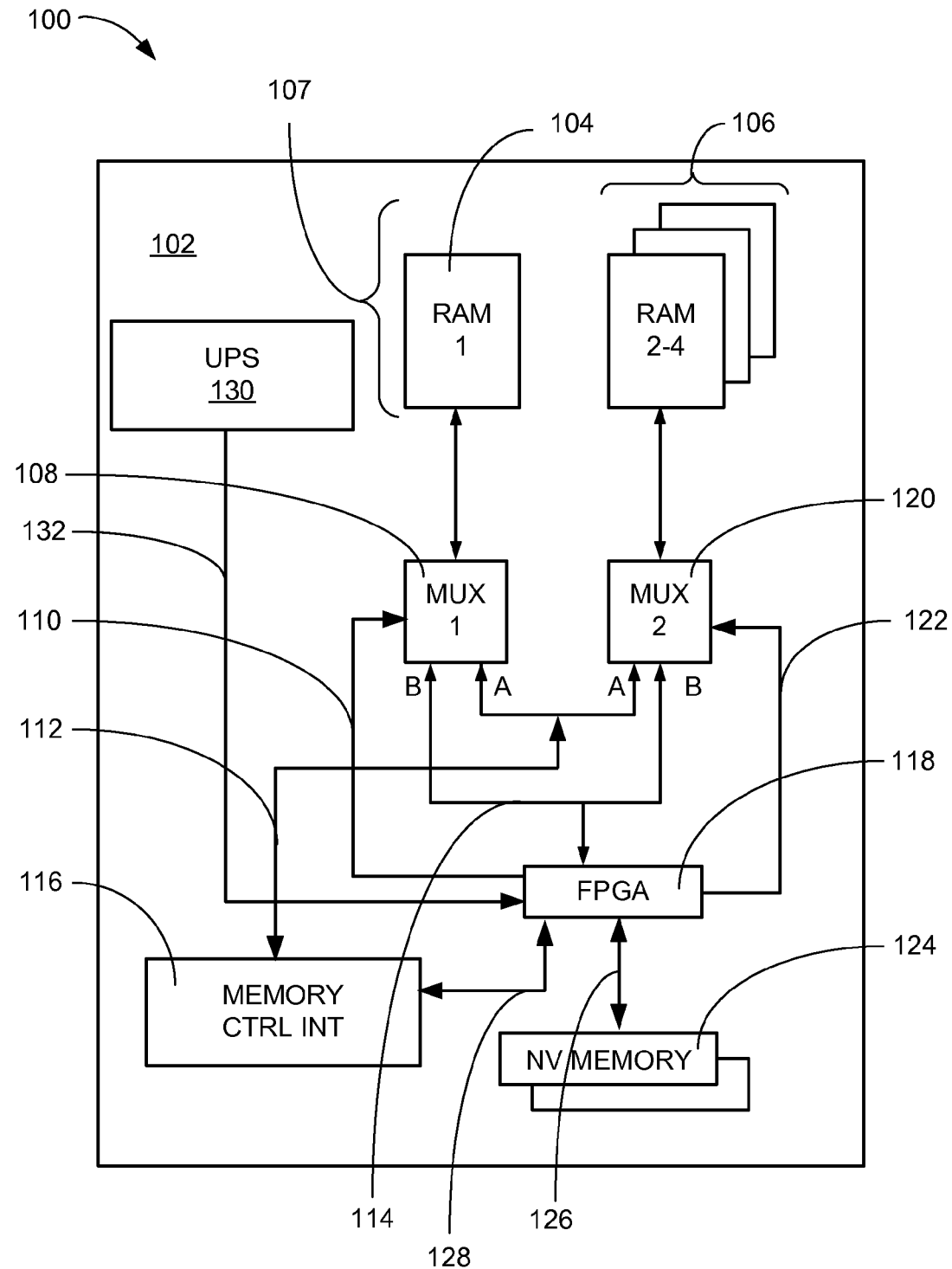
FIG. 1 is a functional block diagram of a memory management system with power source in an embodiment of the present invention.

The following embodiments are described in sufficient detail to enable those skilled in the art to make and use the invention. It is to be understood that other embodiments would be evident based on the present disclosure, and that system, process, or mechanical changes can be made without departing from the scope of the present invention.

In the following description, numerous specific details are given to provide a thorough understanding of the invention. However, it will be apparent that the invention can be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of the DIMM memory mounting surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes assembling data structures, transferring data structures to peripheral storage devices, manipulating data structures, and reading data structures from external sources. Data structures are defined to be files, input data, system generated data, such as calculated data, and program data.

Referring now to FIG. 1, therein is shown a functional block diagram of a memory management system 100 with power source in an embodiment of the present invention. The functional block diagram of the memory management system 100 depicts a dual in-line memory module (DIMM) carrier 102, such as a printed circuit board, having a volatile memory device 104 and subsequent rank memory devices 106. The volatile memory device 104 and the subsequent rank memory devices 106 can be high speed memory 107, which is defined to include dynamic random access memory (DRAM), static random access memory (SRAM), video random access memory (VRAM), or the like that lose data when power is removed.

A first multiplexer 108 can be coupled to the volatile memory device 104. The first multiplexer 108 can provide address and data lines to the volatile memory device 104. It is to be understood that the data lines can be bi-directional and the address lines are unidirectional from the first multiplexer 108. The first multiplexer 108 can have a control line 110 for managing the output of the first multiplexer 108 and selecting between a host interface 112 and a back-up interface 114.

It is understood that the host interface 112 and the back-up interface 114 both have a substantially identical number of address and data lines. The host interface 112 can be sourced from a memory control interface 116, which includes an interface connector (not shown). The memory control interface 116 provides access to the next level system (not shown) for providing a system power, a system data bus, and a system control bus. The back-up interface 114 can be sourced from a control logic unit 118, such as a field programmable gate array (FPGA) or an application specific integrated circuit (ASIC).

A second multiplexer 120 can be coupled to the subsequent rank memory devices 106. The subsequent rank memory devices 106 can include additional memory segments of equal size to the volatile memory device 104. The subsequent rank memory devices 106 can include any number of additional memory segments. By way of example, the subsequent rank memory devices 106 is shown to include three of the additional memory segments, but any number of the additional memory segments can be coupled to the second multiplexer 120.

A back-up control line 122 can be sourced from the control logic unit 118. The back-up control line 122 can manage the output of the second multiplexer 120 for selecting between the host interface 112 and the back-up interface 114.

A non-volatile memory 124 can include a number of flash memory chips having a sufficient capacity to store all of the data from the volatile memory device 104 and the subsequent rank memory devices 106. The non-volatile memory 124 can be coupled to the control logic unit 118 through a non-volatile (NV) memory bus 126. The non-volatile memory bus 126 can include data lines as well as address and control lines.

An interface status bus 128 can couple the memory control interface 116 to the control logic unit 118. The interface status bus 128 can convey availability of the volatile memory device 104 and the subsequent rank memory devices 106. The interface status bus 128 can also provide early warning for system shut down or other error conditions that can activate a memory back-up process.

An uninterruptible power supply 130 monitors the system power provided through the memory control interface 116. Under normal operation the system power provides the energy required to operate all aspects of the "processing system", which includes a processor (not shown), peripheral devices (not shown), and the memory management system 100. During a system fault condition that includes loss of the system power, either unexpectedly or by system power down, the uninterruptible power supply 130 can detect the loss of the system power and switch the operation of the memory management system 100 to a reserve or back-up power source (not shown).

The back-up power source can provide sufficient energy to operate the memory management system 100 but not the rest of the processing system. When the processing system has lost the system power and is no longer capable of altering the volatile memory device 104 or the subsequent rank memory devices 106, the memory management system 100 can transfer the contents of the volatile memory device 104 and the subsequent rank memory devices 106 to the non-volatile memory 124.

A system power failure line 132 couples the uninterruptible power supply 130 to the control logic unit 118. The activation of the system power failure line 132 can trigger the control logic unit 118 to initiate the transfer of the data from the volatile memory device 104 and the subsequent rank memory devices 106 to the non-volatile memory 124.

The above described hardware can detect system fault conditions, such as the failure of the system power, in order to initiate a total memory back-up process. During the total memory back-up process the contents of the volatile memory device 104 and the subsequent rank memory devices 106 are stored in the non-volatile memory 124.

It has been discovered that the uninterruptible power supply 130 of the memory management system 100 can provide the necessary energy to completely preserve all of the data contents of the volatile memory device 104 and the subsequent rank memory devices 106 in the non-volatile memory 124. The detection and activation of the system power failure line 132 can signal the control logic unit 118 can also cause the selection of the back-up power source by the uninterruptible power supply 130 in order to provide the energy required to complete the total memory back-up process.

Thus, it has been discovered that the memory management system 100 and device or product of the present invention furnishes important and heretofore unknown and unavailable solutions, capabilities, and functional aspects for providing an increased level of data reliability while maintaining system performance. The inclusion of the uninterruptable power supply 130, on the DIMM carrier 102, allows additional time to store critical system data before the memory management system 100 is powered off.

Figure 2:
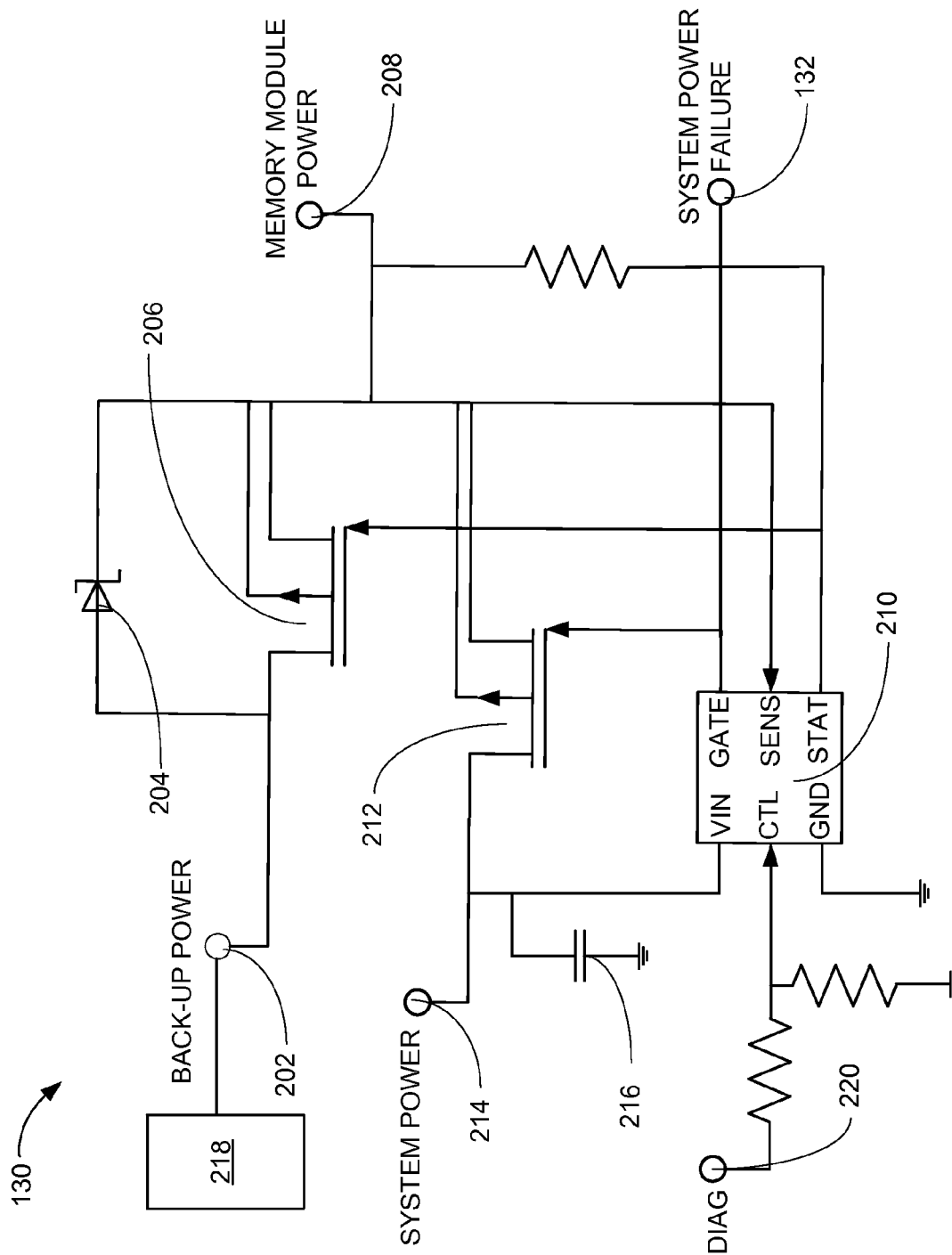
FIG. 2 is a schematic of the uninterruptible power supply, of FIG. 1.

Referring now to FIG. 2, therein is shown a schematic of the uninterruptible power supply 130, of FIG. 1. The schematic of the uninterruptible power supply 130 depicts a back-up power input 202 coupled to the anode of a feed forward diode 204, such as a Schottky diode with very low voltage forward activation, and the drain of an alternative source transistor 206, such as a depletion mode P-channel metal oxide semiconductor field effect transistor (MOSFET).

A memory module power 208 can be sourced from the cathode of the feed forward diode 204 and the source of the alternative source transistor 206 during back-up power operation. If the voltage level of a system power input 214 starts to decay, due to system power being interrupted, a sense input of a voltage switching circuit 210 will detect the decay when a 20 mV drop in the voltage is sensed.

The voltage switching circuit 210 can concurrently activate a STAT output and a Gate output in response to the decay of the system power input 214. The STAT output of the voltage switching circuit 210 can be coupled to the gate of the alternative source transistor 206 in order to turn-on the energy provided through the alternative source transistor 206. In the mean-time, the Gate output of the voltage switching circuit 210 can be coupled to the gate of a system power transistor 212 in order to deactivate the system power transistor 212. The Gate output of the voltage switching circuit 210 can also be coupled to the system power failure line 132 in order to alert the control logic unit 118, of FIG. 1, to the decay of the system power detected by the voltage switching circuit 210.

The drain of the system power transistor 212 can be coupled to a system power input 214, a filter capacitor 216, and the VIN voltage input of the voltage switching circuit 210. The back-up power input 202 can be coupled to an energy source that is not directly related to the system power. The back-up power input 202 can be coupled to a secondary power source 218, such as a battery, a super capacitor, an additional power supply, or a combination thereof. The secondary power source 218 can be set to a first voltage, such as 3.2 volts, during system power operations. In the event the system power failure line 132 is asserted, the secondary power source can be increased to a second voltage level, such as 3.6 volts.

A diagnostic input 220 can be coupled to the CTL input, of the voltage switching circuit 210, through a resistor network. The diagnostic input 220 can be used to disable the Gate output of the voltage switching circuit 210 for testing purposes.

The source of the system power transistor 212 and the source of the alternative source transistor 206 can be coupled to the memory module power 208 for sustaining the operation of the memory management system 100, of FIG. 1, beyond the time provided by the system power. The transition between the alternative source transistor 206 and the system power transistor 212 can occur with as little as 20 mV reduction in the memory module power 208.

It has been discovered that by detecting a decay of the system power, the voltage switching circuit 210 can switch the memory module power 208 from the system power source transistor 212 to the alternative source transistor 206 with no operational loss of energy to the memory management system 100. The transition between the system power source transistor 212 and the alternative source transistor 206 can initiate the total memory back-up process of the memory management system 100.

If the system power input 214 is re-activated after the memory module power 208 has been switched from the system power source transistor 212 to the alternative source transistor 206, the voltage switching circuit 210 can switch-off the alternative source transistor 206 and switch-on the system power source transistor 212. The activation of the system power input 214 also returns the secondary power source 218 to the first voltage. This combination of events once again allows the memory module power 208 to be driven by the system power source transistor 212.

Figure 3:
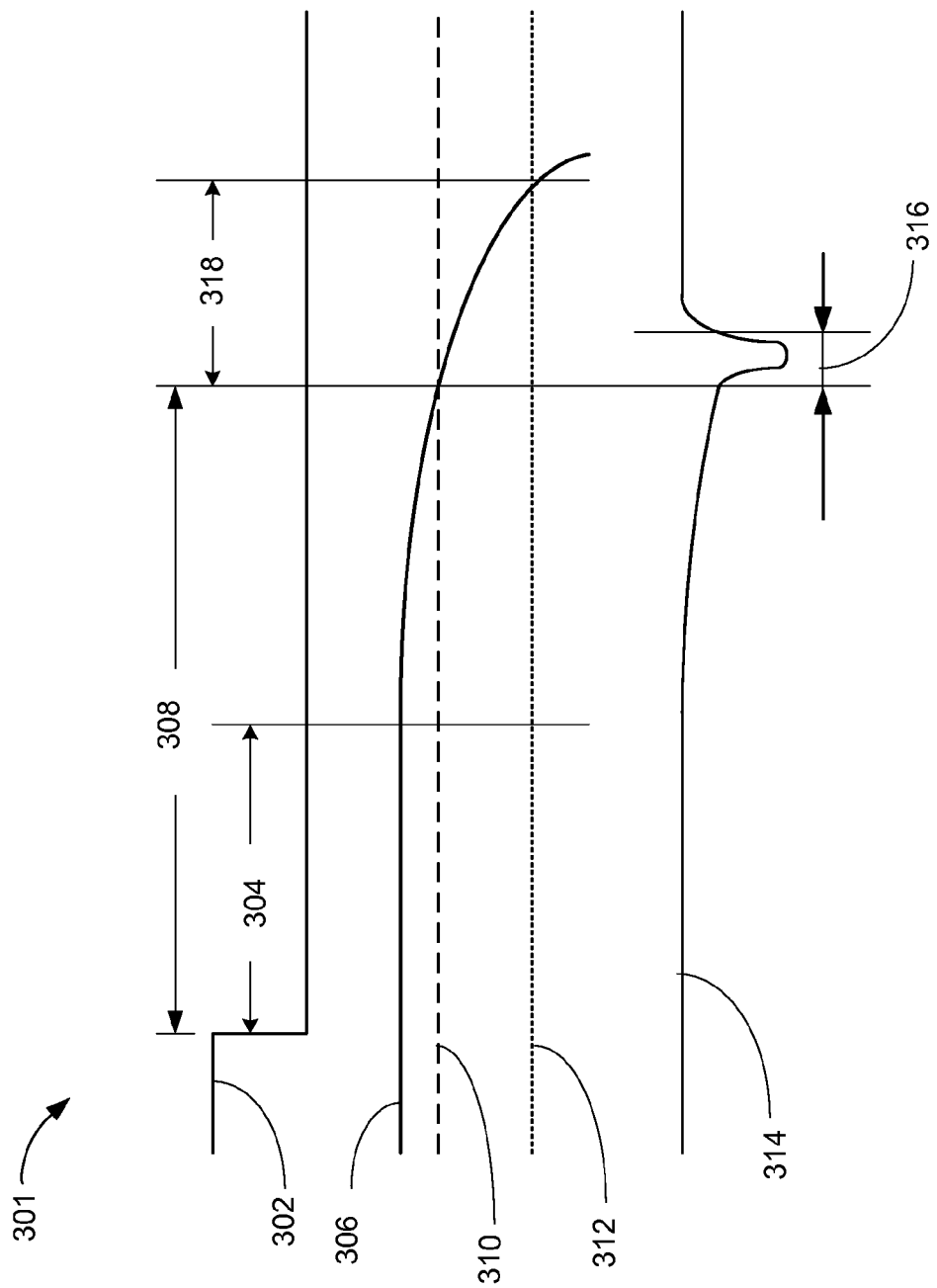
FIG. 3 is a timing diagram of an operation of the uninterruptible power supply of the memory management system, of FIG. 1.

Referring now to FIG. 3, therein is shown a timing diagram 301 of an operation of the uninterruptible power supply 130 of the memory management system 100 of FIG. 1. The timing diagram 301 of the operation of the uninterruptible power supply 130 of the memory management system 100 depicts an input voltage good line 302, indicating that while the input voltage good line 302 is in a high state, indicating that the source voltage to the system power supply is in an operational state. When the input voltage good line 302 transitions to a low state, it is an indication that the source voltage to the system power supply (not shown) is in a non-operational state.

A residual time 304 can indicate the duration from the transition of the input voltage good line 302, from the high state to the low state, until a system power 306 such as a direct current (DC) voltage starts to decay. Prior to the expiration of the residual time 304 there is no detectable decay of the system power 306. At the end of the residual time 304, the system power 306 starts to decay due to the consumption of energy by the overall system (not shown).

At a detection time 308, the system power 306 can decay to a first cross-over level 310. The voltage switching circuit 210, of FIG. 2, can only detect the decay when the system power 306 reaches the first cross-over level 310. The voltage switching circuit 210 can transition from the source of the system power 306 to the back-up power source (not shown) before the system power 306 can decay to a second cross-over level 312, at which point there would be insufficient energy to operate the memory management system 100.

It has been discovered that by detecting the decay of the system power 306, the voltage switching circuit 210 can transition a memory module power 314 between the system power 306 and a back-up power source (not shown) during a transition time 316. The transition time is dependent on the amount of current drawn by the memory management system 100. During the transition time 316 the memory module power 314 can be reduced by no more than 20 mV before returning to the full voltage level of the back-up power source.

A marginal operation time 318 is defined to be the period of time in which the system processor (not shown) will halt all operations to the system memory, including the memory management system 100, prior to halting operations completely. The transition time 316 is shorter than the marginal operation time 318 and marks the beginning of the total memory back-up process of the memory management system 100.

It has been discovered that the detection of the system power 306 decay to the first cross-over level 310 can be detected by the voltage switching circuit 210. The transition time 316 can mark the beginning of the total memory back-up process without a concern that the system processor might still alter the memory. The transition to utilize the back-up power source can maintain the operation of the memory management system 100 well beyond the marginal operation time 318, which represents the time that the system processor can no longer interact with the memory management system 100.

Figure 4:
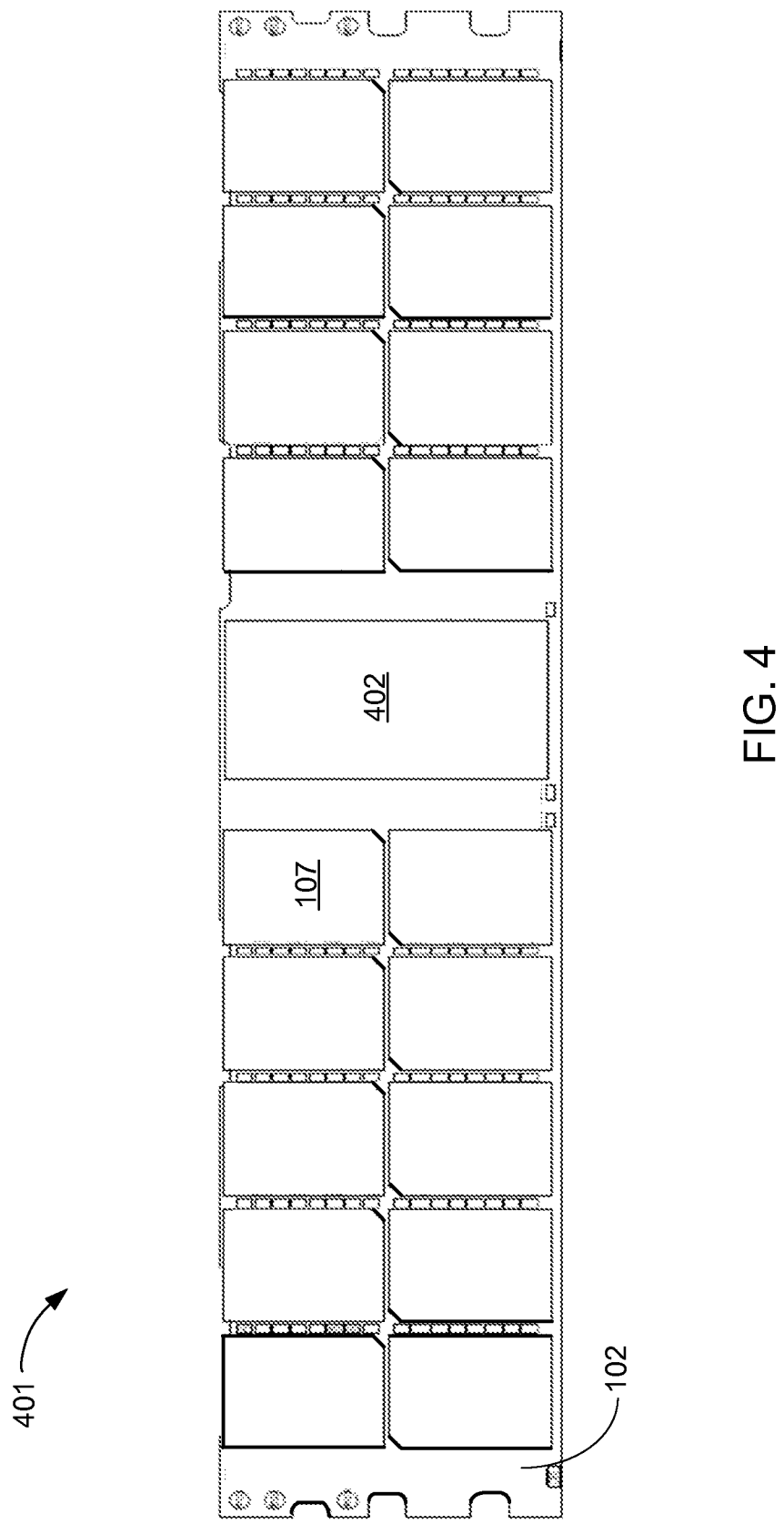
FIG. 4 is a front view of a dual in-line memory module of the memory management system.

Referring now to FIG. 4, therein is shown a front view of a dual in-line memory module 401 of the memory management system 100. The front view of the dual in-line memory module 401 depicts a controller logic integrated circuit 402 mounted in a central location of the DIMM carrier 102. The controller logic integrated circuit 402 is defined to be an integrated circuit package that includes the host interface 112, of FIG. 1, the memory control interface 116, of FIG. 1, the control logic unit 118, of FIG. 1, the first multiplexer 108, of FIG. 1, the second multiplexer 120, of FIG. 1, address buffers (not shown), and data buffers (not shown).

The high speed memory 107 can be arranged in an array around the controller logic integrated circuit 402. The non-volatile memory 124, of FIG. 1, and the uninterruptible power supply 130, of FIG. 1, can be positioned on the backside (not shown) of the DIMM carrier 102.

Figure 5:
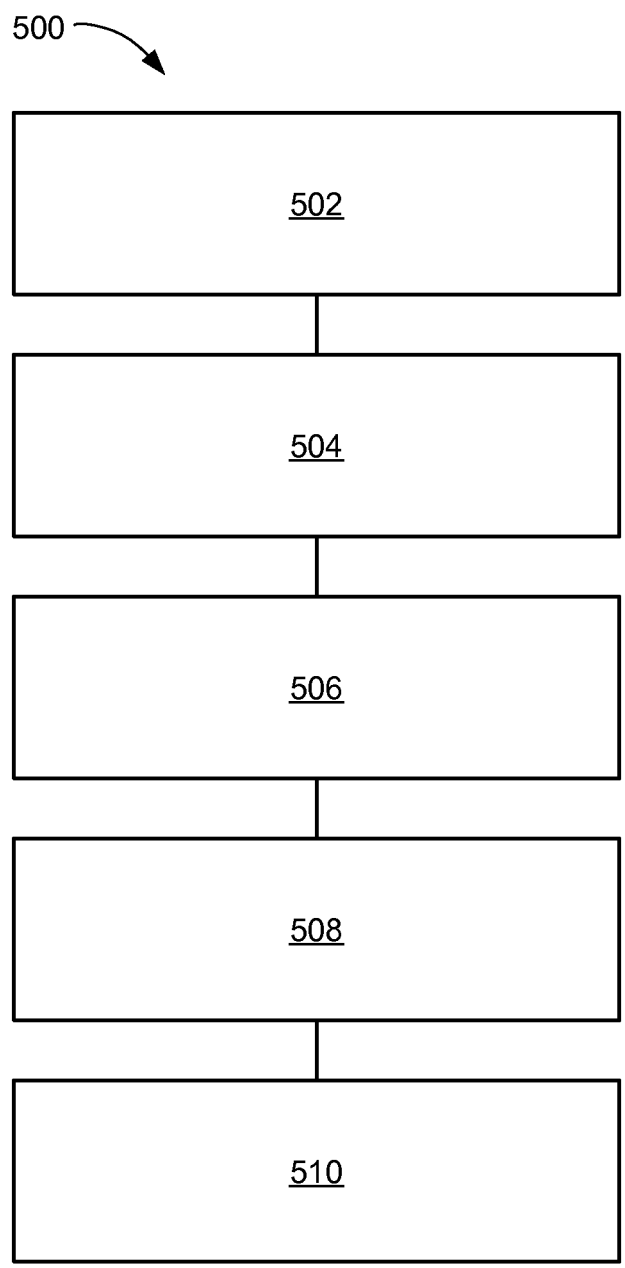
FIG. 5 is a flow chart of a method of manufacture of the memory management system in a further embodiment of the present invention.

Referring now to FIG. 5, therein is shown a flow chart of a method 500 of manufacture of the memory management system 100 in a further embodiment of the present invention. The method 500 includes: fabricating a dual in-line memory module carrier in a block 502; mounting a volatile memory device on the dual in-line memory module carrier in a block 504; mounting a non-volatile memory on the dual in-line memory module carrier on a side opposite the volatile memory device in a block 506; mounting an uninterruptible power supply on the dual in-line memory module carrier for maintaining a memory module power when a system power input decays in a block 508; and mounting a controller logic integrated circuit on the dual in-line memory module carrier coupled to the volatile memory device, the non-volatile memory, and the uninterruptible power supply for copying data content of the volatile memory device to the non-volatile memory when the uninterruptible power supply detects the decay of the system power input to a first cross-over level in a block 510.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing memory management systems with uninterruptible power supply that are fully compatible with conventional manufacturing methods or processes and technologies. The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a memory management system comprising:
   mounting a volatile memory device on a dual in-line memory module carrier; mounting a non-volatile memory on the dual in-line memory module carrier on a side opposite the volatile memory device;
   mounting an uninterruptible power supply on the dual in-line memory module carrier, the uninterruptible power supply configured to maintain a memory module power when a system power input decays, and wherein the memory module power is reduced by less than 20 millivolts (mV) during a transition time when the memory module power is transitioned from the system power input to a back-up power input, wherein the uninterruptible power supply increases the back-up power input from a first voltage to a second voltage upon detecting a loss of system power from the system power input, and wherein the transition time based on an amount of current drawn by the memory management system; and
   mounting a controller logic integrated circuit on the dual in-line memory module carrier coupled to the volatile memory device, the non-volatile memory, and the uninterruptible power supply, the controller logic integrated circuit configured to copy data content of the volatile memory device to the non-volatile memory when the uninterruptible power supply detects that the system power input has decayed to a first cross-over level.

2. The method as claimed in claim 1 further comprising providing a voltage switching circuit in the uninterruptible power supply.

3. The method as claimed in claim 1 further comprising providing a control logic unit in the controller logic integrated circuit.

4. The method as claimed in claim 1 further comprising coupling a source transistor between the memory module power and the system power input.

5. The method as claimed in claim 1 wherein providing the back-up power input, in the uninterruptible power supply, includes coupling a secondary power source on the dual in-line memory module carrier.

6. A method of manufacture of a memory management system comprising: mounting a volatile memory device on the front of dual in-line memory module carrier; mounting a non-volatile memory on the backside of the dual in-line memory module carrier opposite the volatile memory device; mounting an uninterruptible power supply on the dual in-line memory module carrier, the uninterruptible power supply configured to maintain a memory module power when a system power input decays including coupling a back-up power input to a secondary power source, and wherein the memory module power is reduced by less than 20 millivolts (mV) during a transition time when the memory module power is transitioned from the system power input to a back-up power input wherein the uninterruptible power supply increases the secondary power source from a first voltage to a second voltage upon detecting a loss of system power from the system power input, and wherein the transition time based on an amount of current drawn by the memory management system; and mounting a controller logic integrated circuit on the dual in-line memory module carrier coupled to the volatile memory device, the non-volatile memory, and the uninterruptible power supply, the controller logic integrated circuit configured to copy data content of the volatile memory device to the non-volatile memory when the uninterruptible power supply detects that the system power input has decayed to a first cross-over level, and enabling a back-up transistor to utilize the secondary power source.

7. The method as claimed in claim 6 further comprising providing a voltage switching circuit, in the uninterruptible power supply, coupled to a source transistor and the back-up transistor.

8. The method as claimed in claim 6 further comprising providing a control logic unit in the controller logic integrated circuit including controlling a first multiplexer between the volatile memory device and the non-volatile memory.

9. The method as claimed in claim 6 further comprising coupling a source transistor between the memory module power and the system power input including providing a voltage switching circuit for disabling the source transistor and enabling the back-up transistor.

10. The method as claimed in claim 6 wherein mounting the uninterruptible power supply includes mounting the uninterruptible power supply having the back-up power input coupled to an anode of a diode and a drain of a transistor.

11. A memory management system comprising:
- a dual in-line memory module carrier;
- a volatile memory device mounted on the dual in-line memory module carrier;
- a non-volatile memory mounted on the dual in-line memory module carrier on a side opposite the volatile memory device;
- an uninterruptible power supply on the dual in-line memory module carrier, the uninterruptible power supply configured to maintain a memory module power when a system power input decays, and
- wherein the memory module power is reduced by less than 20 millivolts (mV) during a transition time when the memory module power is transitioned from the a system power input to a back-up power input, wherein the uninterruptible power supply increases the secondary power source from a first voltage to a second voltage upon detecting a loss of system power from the system power input, and
- wherein the transition time based on an amount of current drawn by the memory management system; and
- a controller logic integrated circuit mounted on the dual in-line memory module carrier coupled to the volatile memory device, the non-volatile memory, and the uninterruptible power supply, the controller logic integrated circuit configured to copy data content of the volatile memory device to the non-volatile memory when the uninterruptible power supply detects that the system power input has decayed to a first cross-over level.

12. The system as claimed in claim 11 further comprising a voltage switching circuit in the uninterruptible power supply.

13. The system as claimed in claim 11 further comprising a control logic unit in the controller logic integrated circuit.

14. The system as claimed in claim 11 further comprising a source transistor coupled between the memory module power and the system power input.

15. The system as claimed in claim 11 wherein the back-up power input, in the uninterruptible power supply, is coupled to a secondary power source on the dual in-line memory module carrier.

16. The system as claimed in claim 11 further comprising:
- the back-up power input, on the uninterruptible power supply, coupled to a secondary power source; and
- a back-up transistor enabled to utilize the secondary power source.

17. The system as claimed in claim 16 further comprising a voltage switching circuit in the uninterruptible power supply coupled to a source transistor and the back-up transistor.

18. The system as claimed in claim 16 further comprising a control logic unit in the controller logic integrated circuit includes a first multiplexer between the volatile memory device and the non-volatile memory.

19. The system as claimed in claim 16 further comprising a source transistor between the memory module power and the system power input includes a voltage switching circuit for disabling the source transistor and enabling the back-up transistor.

20. The system as claimed in claim 16 wherein the uninterruptible power supply includes the back-up power input coupled to an anode of a diode and a drain of a transistor.

* * * * *